United States Patent [19]

Fukumizu

[11] Patent Number: 5,006,848
[45] Date of Patent: Apr. 9, 1991

[54] ROTARY ENCODER CAPABLE OF GENERATING ELECTRONIC PULSES HAVING VARIABLE FREQUENCY WITHOUT CHANGING ROTARY PLATE

[75] Inventor: Toshiyuki Fukumizu, Itami, Japan

[73] Assignee: Mitsubishi Denki Kabushiki Kaisha, Tokyo, Japan

[21] Appl. No.: 362,110

[22] Filed: Jun. 6, 1989

[30] Foreign Application Priority Data

Feb. 8, 1989 [JP] Japan .................. 1-28890

[51] Int. Cl.$^5$ .............................................. H03M 1/22
[52] U.S. Cl. .......................................... 341/13; 341/15
[58] Field of Search ...................... 341/13, 15, 16, 171

[56] References Cited

U.S. PATENT DOCUMENTS

| | | | |
|---|---|---|---|
| 4,465,928 | 8/1984 | Breslow | 341/13 |
| 4,476,457 | 10/1984 | Kondo | 341/13 |
| 4,559,525 | 12/1985 | Abt et al. | 341/16 |
| 4,593,269 | 6/1986 | Nakamura et al. | 341/13 |
| 4,670,737 | 6/1987 | Rilling | 341/13 |
| 4,727,356 | 2/1988 | Abe et al. | 341/13 |
| 4,788,422 | 11/1988 | Fujiwara | 341/13 |
| 4,899,145 | 2/1990 | Okuda et al. | 341/171 |

Primary Examiner—William M. Shoop, Jr.
Assistant Examiner—Helen Kim
Attorney, Agent, or Firm—Oblon, Spivak, McClelland, Maier & Neustadt

[57] ABSTRACT

Electrodes (6) provided on the inner periphery of a rotary plate (3) are different in number from those provided on the outer periphery. A slide knob (12) moves a contact part (5) along the plane of the rotary plate (3). Thus, the number of electric pulses generated every rotation of the rotary plate (3) when the contact part (5) is in the inner periphery is different from that when the contact part (5) is in the outer periphery.

5 Claims, 4 Drawing Sheets ic pulses 8 generated

ROTARY ENCODER CAPABLE OF GENERATING ELECTRONIC PULSES HAVING VARIABLE FREQUENCY WITHOUT CHANGING ROTARY PLATE

BACKGROUND OF THE INVENTION

1. Field of the Invention

The present invention relates to a rotary encoder, which is applied to a frequency selecting dial part of a digital tuner, a part for measuring the amount of movement of a mouse or the like.

2. Description of the Background Art

FIG. 1 illustrates the structure of a conventional contact type rotary encoder, which is applied to a frequency selecting dial part of a digital tuner, for example.

When a frequency selecting dial I is rotated, a rotary plate 3 coupled to the dial I through a rotary shaft 2 is rotated in the same direction as the dial 1, whereby a contact part 5 fixed by a holder 4 is repeatedly brought into contact with / separated from electrodes 6, which are provided on the rotary plate 3. Pulses are generated by such repetition of contact/separation between the contact part 5 and the electrodes 6, to change a frequency selected by the tuner in response to the number of the generated pulses.

In the conventional rotary encoder having the aforementioned structure the electrodes 6 are arranged on the rotary plate 3 as shown in FIG. 2. Therefore, the number of pulses generated every rotation of the rotary plate 3 is fixed sO that the rotary plate 3 must be replaced in order to mechanically change the ratio of &he angle of rotation of the rotary plate 3 tO the number of generated pulses.

SUMMARY OF THE INVENTION

A rotary encoder according to the present invention comprises a rotary plate having a plane on which a plurality of elements to be detected are provided in a predetermined arrangement in such a manner that the elements to be detected are different in number between inner and outer portions of the plane, supporting means for rotatably supporting the rotary plate, detecting means arranged opposite to face the plane of the rotary plate for detecting the elements to be detected in response to rotation of the rotary plate to generate electric pulses, and moving means for moving the detecting means along the plane o( the rotary plate.

According to the present invention, detective parts provided on the plane of a rotary plate are made different in number between inner and outer portions of the plane while detecting means is adapted to be movable along the plane of the rotary plate, whereby the number of pulses generated every rotation Of the rotary plate can be arbitrariy changed without replacing the rotary plate.

Accordingly, an object of the present invention is to provide a rotary encoder, which can mechanically change the number of pulses generated every rotation of a rotary plate without replacing the rotary plate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
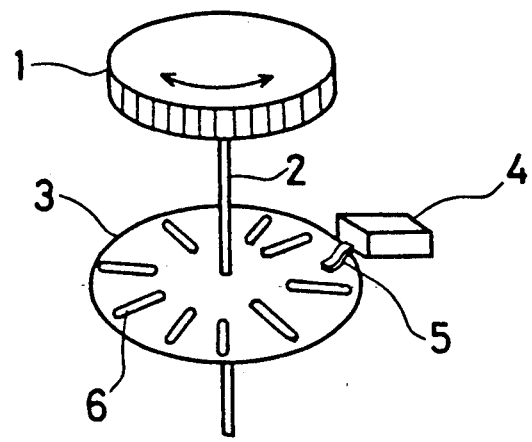
FIG. 1 illustrates a conventional rotary encoder.
Figure 2:
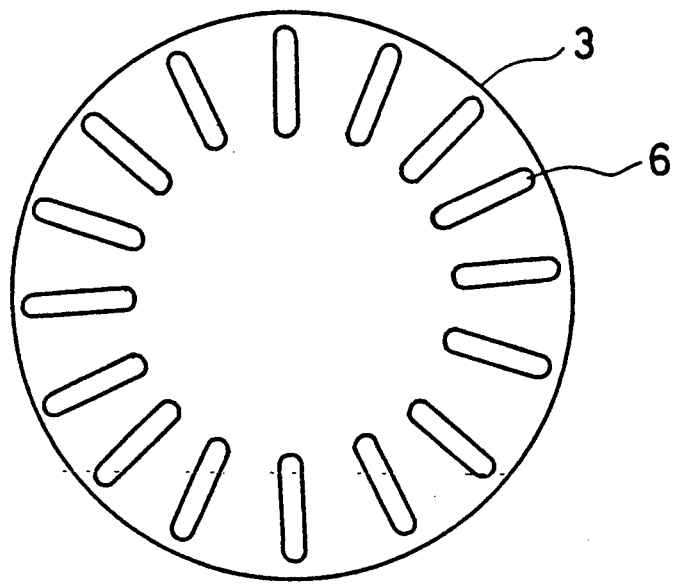
FIG. 2 illustrates the structure of a conventional rotary plate.
Figure 3:
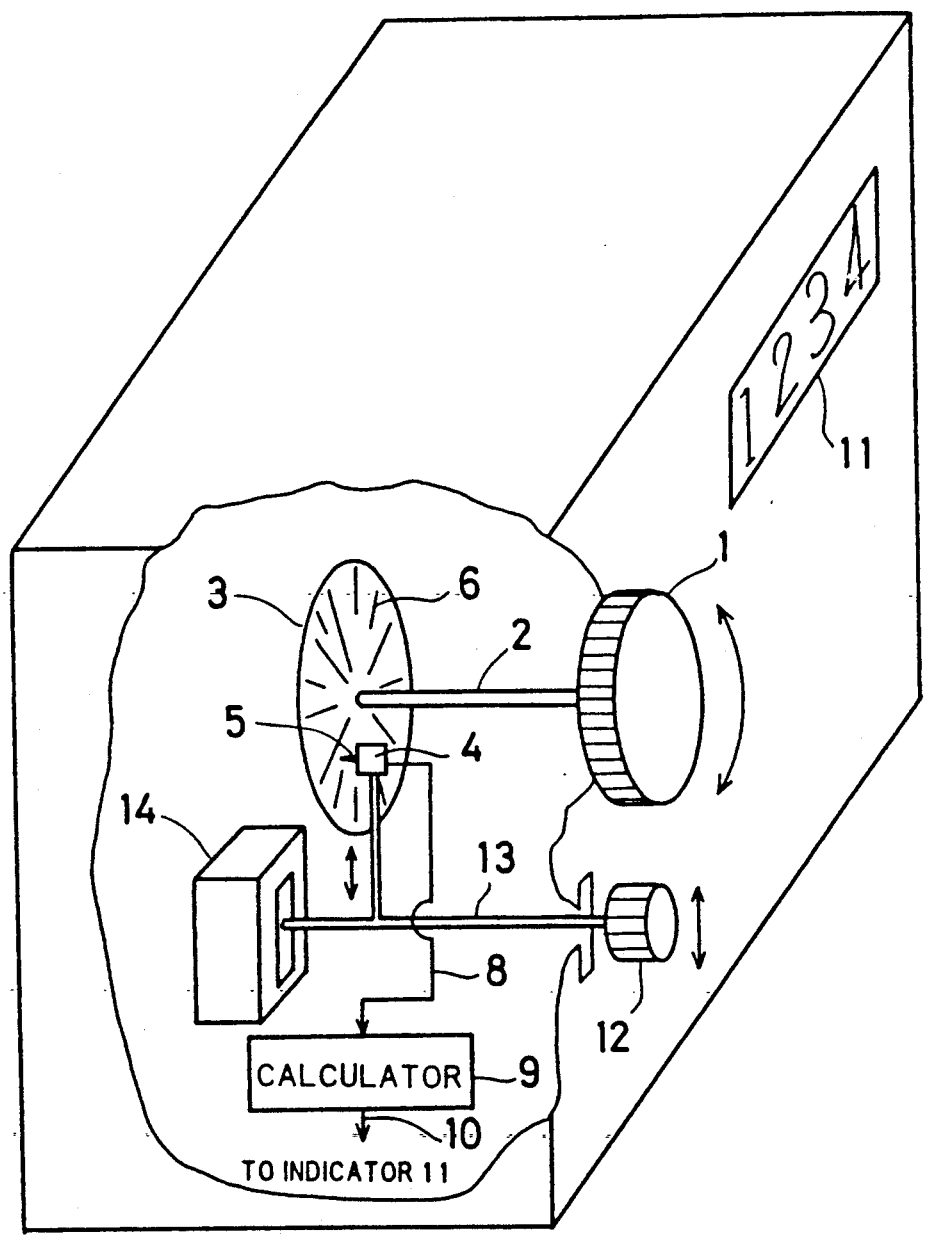
FIG. 3 illustrates an embodiment of a rotary encoder according to the present invention.

FIG. 3 is a perspective view showing a digital tuner, in which an embodiment of a rotary encoder according to the present invention is applied.

When a dial is rotated, a rotary shaft 2 and a rotary plate 3 are rotated in the same direction at the same angle of rotation as the dial 1. Upon such rotation of the rotary plate 3, a contact part 5 provided in a holder 4 is repeatedly brought into contact with / separated from electrodes 6, therebY to repeatedly enter conducting-/insulated states. Thus, electric pulses 8 are generated to be supplied to a calculator 9. The calculator 9 supplies an indicator with a calculation result 10, which is responsive to the number of the electric pulses 8. The indicator 11 numerically indicates a frequency selected on the basis of the calculation result 10.

Figure 4A:
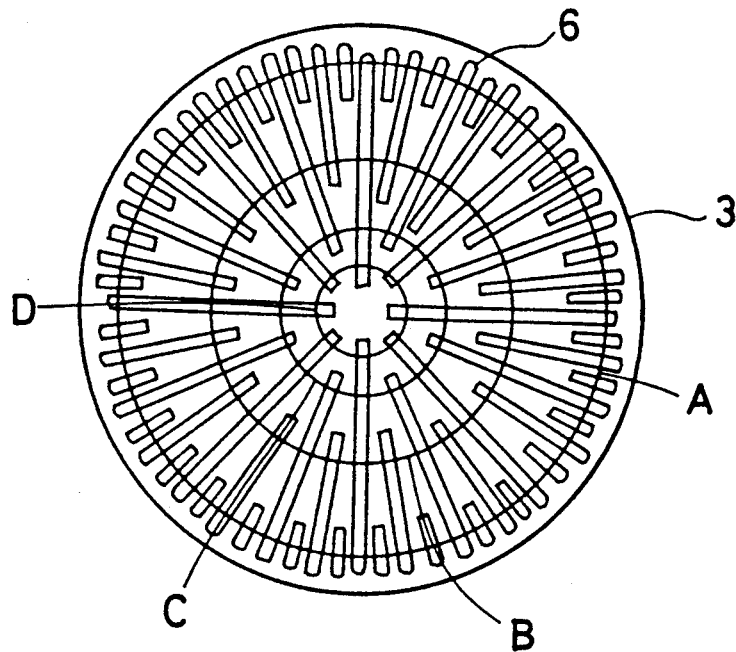
FIG. 4A illustrates exemplary structure of a rotary plate.

FIG. 4A illustrates exemplary structure of the rotary plate 3 which is applied to the rotary encoder according to the present invention. As shown in FIG. 4A, electrodes 6 are so arranged on the rotary plate 3 as to be increased in number on concentric circles as the outer periphery is approached. In order to change a larger number of frequencies at smaller angles of rotation, a slide knob 12 is slid in the downward direction. Then, a coupling rod 13 coupling the slide knob 12 with the holder 4 is also slid in the downward direction, whereby the contact part 5 is moved toward the outer periphery of the rotary plate 3. Another end of the coupling rod 13 is supported by a supporting part 14. Then the dial 1 is rotated in a desired direction. At this time, the contact part 5 draws a circular locus A as shown in FIG. 4A, and the number of times of contact between the contact part 5 and the electrodes 6 is increased as compared with those in the cases where the contact part 5 draws circular loci B, C an D. Thus, the number of the electric pulses 8 generated every rotation of the rotarY plate 3 is also increased, thereby to increase an amount of frequencies changed in response to the rotation of the rotary plate 3.

When fine adjustment is desired for tuning, the slide knob 12 is slid in the upward direction. Then, the contact part 5 is moved toward the inner periphery of the rotary plate 3. When the dial is rotated in a desired direction, the contact part 5 draws the circular locus D shown in FIG. 4A, whereby the number of times of contact between the contact part 5 and the electrodes 6 is reduced as compared with those in the cases where the contact part 5 draws the circular loci A, B and C. Thus, the number of the electric pulses 8 generated every rotation of &he rotary plate 3 is also reduced, to enable fine adjustment of tuning.

When the rotary plate 3 has the electrodes 6 arranged as shown in FIG. 4A, the electric pulses 8 generated every rotation of the rotary plate 3 can be set in four types of numbers by changing the locus of the contact part 5 along the circles A to D through sliding movement of the slide knob 12.

Figure 4B:
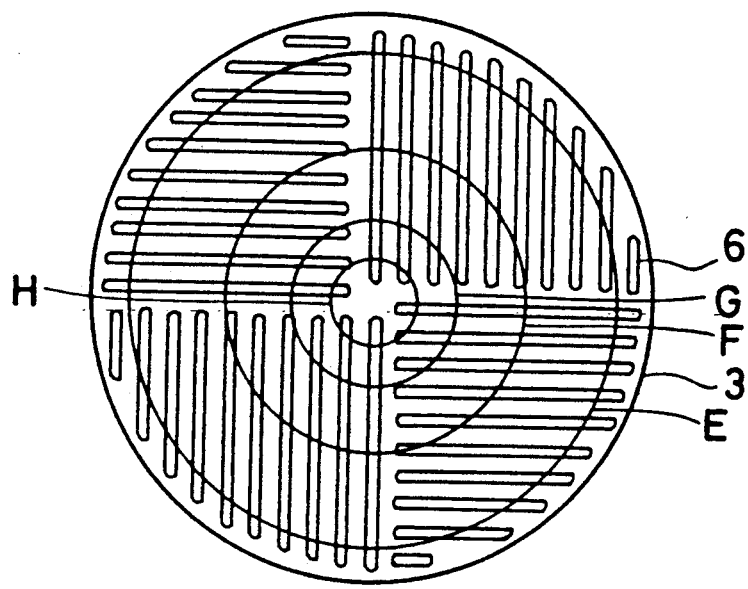
FIG. 4B illustrates another exemplary structure of the rotary plate.

FIG. 4B illustrates another exemplary structure of the rotary plate 3. The slide knob 12 is so slid as to set the locus of the contact part 5 drawn on the rotary plate 3 along circles E to H shown in FIG. 4B. The number of times of contact between the contact part 5 and the electrodes 6 is varied with the respective circular loci E to H, whereby the electric pulses 8 generated every rotation of the rotary plate 3 can be varied in number similarly to the rotary plate 3 shown in FIG. 4A.

Figure 5:
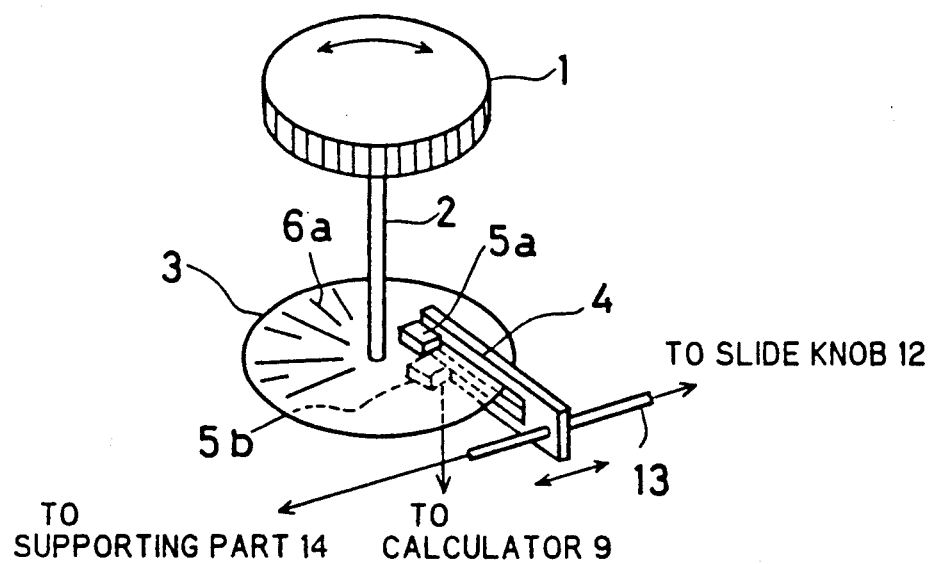
FIG. 5 and FIG. 6 illustrate other embodiments of the present invention.

Although the above embodiment has been described with reference to a contact type rotary encoder, the present invention is also applicable to a non-contact type rotary encoder. FIG. 5 illustrates the structure of a transmission type non-contact rotary encoder. Referring to FIG. 5, this transmission type rotary encoder is different from the contact type rotary encoder shown in FIG. 3 in that the contact part 5 is replaced by a photointerrupter which is formed by a light emitting part 5a and a light receiving part 5b which are held by a holder 4 in a manner that a rotary plate 3 is interposed therebetween, and the electrodes 6 provided on the rotary plate 3 are replaced by slits 6a. Other structure is similar to that shown in FIG. 3.

The light emitting part 5a regularly emits light. When the rotary plate 3 is rotated, the light from the light emitting part 5a is detected by the light receiving part 5b upon passage through every slit 6a, to generate electric pulses. The number of pulses generated every rotation of the rotary plate 3 can be varied by moving the photointerrupter, which is formed by the light emitting part 5a and the light receiving part 5b, along the plane of the rotary plate 3.

Figure 6:
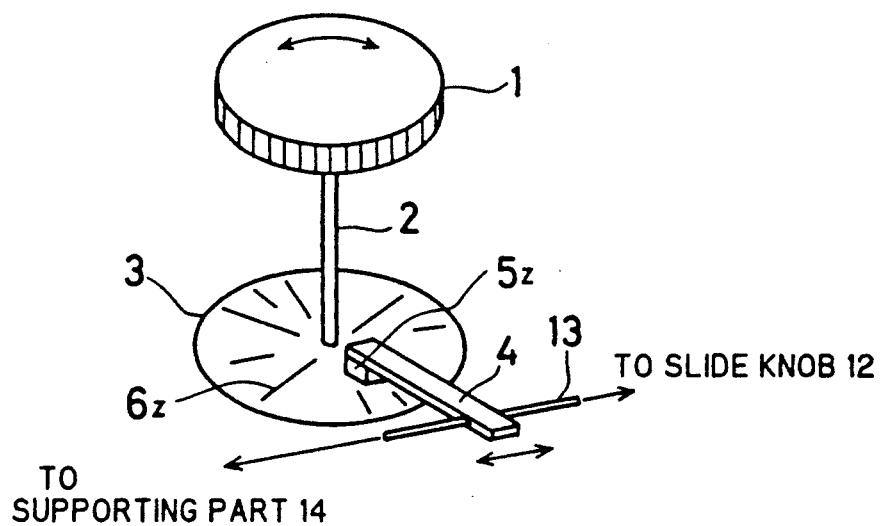

FIG. 6 shows the structure of a reflection type non-contact rotary encoder. Referring to FIG. 6, the reflection type rotary encoder is different from the contact type rotary encoder shown in FIG. 3 in that the electrodes 6 provided on the rotary plate 3 are replaced by reflectors 6z, and the contact part 5 is replaced by a reflection type photosensor 5z, which has a light emitting part for emitting light receiving part for receiving light reflected by the reflectors 6z. Other structure is similar to that shown in FIG. 3. The light emitting part of the reflection type photosensor 5z regularly emits light. When the rotary plate 3 is rotated, the reflected light is detected by the light receiving part upon passage of every reflector 6z, to generate electric pulses. The number of pulses generated every rotation of the rotary plate 3 can be varied by moving the reflection type photosensor 5z along the plane of the rotary plate 3.

Although each of the above embodiments has been described with reference to a rotary encoder which is applied to a tuner, the present invention is also applicable to all types of other apparatuses requiring detection of numbers or angles of rotation. The number of elements to be detected such as the electrodes 6, the slits 6a or the reflectors 6z provided on the plane of the rotary plate 3 may not be increased toward the outer periphery of the rotary plate 3, but the point is that the elements to be detected provided in the outer periphery are different in number from those provided in the inner periphery.

Further, detecting means such as the contact part 5, the photointerrupter (the light emitting part 5a and the light receiving part 5b) or the reflection type photosensor 5z may not necessarily be linearly slid by the slide knob 12, but may be moved by any other method so far as the detecting means can be moved between the inner and outer peripheries along the plane of the rotary plate 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A rotary encoder comprising:
   a rotary plate having a plane on which a plurality of elements to be detected are provided in a predetermined arrangement in such a manner that said elements to be detected are different in number along inner and outer concentric circles arranged with respect to a rotation center of the rotary plate;
   supporting means for rotatably supporting said rotary plate;
   detecting means arranged opposite to said plane of said rotary plate for detecting said elements to be detected in response to rotation of said rotary plate to generate electric pulses, said detecting means detecting said elements to be detected on a desired concentric circle with respect to the rotation center of the rotary plate; and
   moving means for moving said detecting means along said plane of said rotary plate.

2. A rotary encoder in accordance with claim 1, wherein
   said elements to be detected include electrodes,
   said detecting means comprising
   a contact part for generating electric pulses by alternately repeating contact with and separation from said electrodes in response to the rotation of said rotary plate, and
   a holder for holding said contact part on said plane of said rotary plate 3. A rotary encoder in accordance with claim 1, wherein
   said elements to be detected include slits,
   said detecting means comprising a photointerrupter having a light emitting part and a light receiving part for generating electric pulses by intermittently receiving light from said light emitting part through said slits by said light receiving part in response to the rotation of said rotary plate, and
   a holder for holding said photointerrupter in a manner that said rotary plate is interposed between said light emitting receiving parts.

4. A rotary encoder in accordance with claim 1, wherein
   said elements to be detected include reflectors,
   said detecting means comprising a reflection type photosensor having a light emitting part and a light receiving part for generating electric pulses by intermittently receiving light emitted from said light emitting part and reflected by said reflectors by said light receiving part in response to the rotation of said rotary plate, and
   a holder for holding said photosensor opposite to said plane of said rotary plate.

5. A rotary encoder in accordance with claim 1, wherein
   said moving means comprises
   a coupling rod coupled to said detecting means,
   a supporting member for slidably supporting said coupling rod, and
   a slide knob coupled to said coupling rod for sliding said coupling rod to move said detecting means along said plane of said rotary plate.

* * * * *